United States Patent [19]
Epler et al.

[11] Patent Number: 5,436,192
[45] Date of Patent: * Jul. 25, 1995

[54] METHOD OF FABRICATING SEMICONDUCTOR STRUCTURES VIA PHOTO INDUCED EVAPORATION ENHANCEMENT DURING IN SITU EPITAXIAL GROWTH

[75] Inventors: John E. Epler, Cupertino; Thomas L. Paoli, Los Altos, both of Calif.

[73] Assignee: Xerox Corporation, Stamford, Conn.

[*] Notice: The portion of the term of this patent subsequent to Oct. 9, 2007 has been disclaimed.

[21] Appl. No.: 579,218

[22] Filed: Sep. 5, 1990

Related U.S. Application Data

[63] Continuation of Ser. No. 328,988, Mar. 24, 1989, abandoned.

[51] Int. Cl.⁶ .......................................... H01L 21/20
[52] U.S. Cl. .................................. 437/129; 437/126; 437/173; 437/935; 437/936
[58] Field of Search .................. 357/16, 4, 17, 35, 19, 357/34; 372/50, 45; 437/173, 126, 129, 935, 936, 90

[56] References Cited

U.S. PATENT DOCUMENTS

| | | | |
|---|---|---|---|
| 4,115,163 | 9/1978 | Gorina et al. | 437/173 |
| 4,148,045 | 4/1979 | Fang et al. | 357/17 |
| 4,433,417 | 2/1984 | Burnham et al. | 357/17 |
| 4,577,321 | 3/1986 | Carney et al. | 372/45 |
| 4,751,194 | 6/1988 | Cibert et al. | 437/24 |
| 4,782,035 | 11/1988 | Fujiwara | 148/DIG. 48 |
| 4,835,578 | 5/1989 | Ohtoshi et al. | 357/16 |
| 4,918,028 | 4/1990 | Shirai | 148/DIG. 48 |
| 4,933,299 | 6/1990 | Durose | 437/935 |
| 4,959,245 | 9/1990 | Dobson et al. | 156/612 |
| 4,962,057 | 10/1990 | Epler et al. | 437/81 |
| 5,013,684 | 5/1991 | Epler et al. | 437/129 |
| 5,114,877 | 5/1992 | Paoli et al. | 437/173 |

FOREIGN PATENT DOCUMENTS

| | | | |
|---|---|---|---|
| 52-44192 | 4/1977 | Japan | 372/50 |
| 59-181060 | 10/1984 | Japan | 357/35 |
| 61-97966 | 5/1986 | Japan | 357/34 |

OTHER PUBLICATIONS

J. E. Epler, et al. "In situ laser patterned desorption of GaAs quantum wells for monolithic multiple wavelength diode lasers" Appl. Phys. Lett 54 (10), 6 Mar. 1989, pp. 881–883.

W. D. Goodhue et al., "Planar Quantum wells With Spatially Dependent thicknesses and Al Content", Journal of Vacuum Science and Technology B, vol. 6(3), pp. 846–849, May/Jun. 1988.

H. Tanaka et al., "Single–Longitudinal–Mode Self Aligned AlGa(As) Double–Heterostructure Lasers Fabricated by Molecular Beam Epitaxy", Japanese Journal of Applied Physics, vol. 24, pp. L89–L90, 1985.

A. C. Warren et al., "Masked, Anisotropic Thermal Etching and Regrowth for In Situ Patterning of Compound Semiconductors", Applied Physics Letters, vol. 51(22), pp. 1818–1820, Nov. 30, 1987.

Primary Examiner—R. Bruce Breneman
Assistant Examiner—Linda J. Fleck
Attorney, Agent, or Firm—William Propp

[57] ABSTRACT

The technique of induced evaporation enhancement is used in MOCVD to accomplish geometrical variations via atomic level removal or thinning or negative growth techniques in situ during or after epitaxial growth thereby varying optical and electrical properties of fabricated semiconductor structures during growth. Among the structures capable of being fabricated are three dimensional buried heterostructures, transparent window lasers, multiple wavelength array lasers, index guided and antiguided mechanisms and transparent optical waveguide structures for optical signal coupling in integrated circuitry.

25 Claims, 10 Drawing Sheets

METHOD OF FABRICATING SEMICONDUCTOR STRUCTURES VIA PHOTO INDUCED EVAPORATION ENHANCEMENT DURING IN SITU EPITAXIAL GROWTH

GOVERNMENT RIGHTS

The Government has certain rights in this invention pursuant to Contract No. 86F173100 awarded by the Defense Advanced Research Projects Agency (DARPA).

CROSS-REFERENCE TO RELATED APPLICATIONS

This is a continuation of application Ser. No. 07/328,988, filed on Mar. 24, 1989, now abandoned.

This application contains subject matter that is related to subject matter of U.S. Pat. No. 4,962,057, patent application Ser. No. 07/328,275, filed Mar. 24, 1989 and U.S. Pat. No. 5,013,684, both assigned to the same assignee herein.

BACKGROUND OF THE INVENTION

This invention relates generally to the vapor deposition of thin films and more particularly to the semiconductor devices fabricated by employing techniques set forth in U.S. patent application Ser. No. 07/177,563, filed Mar. 4, 1988, and U.S. patent application Ser. No. 07/354,052, filed May 19, 1989, a divisional application of U.S. patent application Ser. No. 07/177,053, U.S. Pat. No. 4,962,057, which are incorporated herein by reference thereto. Specifically, the semiconductor devices and structures disclosed herein are fabricated employing in situ photo induced modifications to compound films of such devices and structures during epitaxial growth.

The two above mentioned applications relate to in situ techniques using a scanned laser beam across or exposure of radiation through a mask to a growth surface to either selectively growth enhance and/or selectively evaporation enhance regions of the growth surface to provide three dimensional nonplanar effects in the film or layer in situ either during growth of a layer or upon termination of layer growth but prior to growth of the next layer. The enhancement effect is photo induced as taught in the foregoing applications and, in particular, is patterned to produce such three dimensional features to conform to desired geometrical and/or stoichiometric features in a semiconductor device or structure. Due to these abilities of enhancement effects, it is possible to grow desired configurations in situ without need for any intermittent removal of the structure from the processing reactor prior to completion of epitaxial growth eliminating oxygen or air, solvent, and etchant contamination and providing a resultant morphology that is sculpturally smooth and atomically continuous at processed regions of epitaxially grown layers.

Techniques in MBE processing using thermal evaporation have been employed to provide a pattern in heterostructures. In one case, a plurality of GaAs quantum well layers separated by AlGaAs barrier layers were grown in MBE on a GaAs substrate mounted on a slotted susceptor so that a temperature differential is established across the supported substrate. In this manner, the thickness of the deposited GaAs and AlGaAs layers would be thinner over deposited regions on firm substrate having a 30° C. to 50° C. higher temperature gradient over substrate temperature compared to adjacent regions over susceptor recesses. See W. D. Goodhue et al, "Planar Quantum wells With Spatially Dependent thicknesses and Al Content", *Journal of Vacuum Science and Technology* B, Vol. 6(3), pp. 846–849, May/June 1988. It was recognized that for quantum well structures grown above 700° C., the thickness of these alternating well/barrier layers decreases as the temperature increases.

In another case, represented by two examples, patterning is achieved by quasi-in situ thermal processing wherein thermal etching is employed to selectively remove GaAs. In one example, a n-GaAs layer over a p-AlGaAs layer is first, selectively, chemically etched in a particular region followed by thermal etching to remove the remaining thin GaAs left from chemical etching before proceeding with regrowth of the p-AlGaAs layer. This forms a buried reverse biased current confinement mechanism in a double heterostructure laser. H. Tanaka et al, Single-Longitudinal-Mode Self Aligned AlGa(As) Double-Heterostructure Lasers Fabricated by Molecular Beam Epitaxy", *Japanese Journal of Applied Physics*, Vol. 24, pp. L89–L90, 1985. In the other example, a GaAs/AlGaAs heterostructure partially masked by a metallic film is thermally etched in an anisotropic manner illustrating submicron capabilities for device fabrication. A. C. Warren et al, "Masked, Anisotropic Thermal Etching and Regrowth for In Situ Patterning of Compound Semiconductors", *Applied Physics Letters*, Vol. 51(22), pp. 1818–1820, Nov. 30, 1987. In both of these examples, an AlGaAs masking layer is recognized as an etch stop to provide for the desired geometric configuration in thermally etched GaAs, although it is also known that, given the proper desorption parameters, AlGaAs may also be thermally etched at higher temperatures and different attending ambient conditions visa vis GaAs.

However, none of these techniques employ photo induced evaporation as a technique in a film deposition system to incrementally reduce, on a minute scale, film thickness in patterned or selective locations at the growth surface either during or after film growth in situ, producing smooth sculptured surface morphology which is a principal objective of this invention.

Thus, it is an object of this invention to fabricate heterostructures and semiconductor devices with various selective optical and electrical properties, such as, heterostructure laser arrays with multiple wavelength emitters, index waveguiding features, nonabsorbing waveguide and window features, phase locked arrays, distributed feedback structures, semiconductor wires and field effect transistors, produced by the patternable negative growth process of U.S. Pat. No. 4,962,057 coupled with the patternable positive growth process of U.S. patent application Ser. No. 07/354,052 or coupled with conventional nonpatternable positive growth processes capable of producing in situ three dimensional crystal features during in situ epitaxial growth of such heterostructures and semiconductor devices.

SUMMARY OF THE INVENTION

According to this invention, in situ three dimensional structural features are provided during heterostructure or semiconductor device growth. A patternable negative growth process is coupled with a uniform positive growth process to induce selective thinning of regions of semiconductor layers in three dimensional crystal structures limited only by the functional capabilities of the growth reactor. Selective monotonic increasing and decreasing film thickness can be accomplished while beam illumination remains stationary for a predetermined period of time with exposure of the growth surface accomplished through a patterned mask or, alternatively, while the beam spot or multiple beam spots are modulated and/or scanned across the growth surface. The changes or variations in film thickness are useful in fabricating semiconductor devices having regions of different geometrical, electrical and optical properties produced in situ in one or more semiconductor layers of such devices. In particular, the precise control provided by photo induced evaporation enhancement permits reproducible control and yields in the selection of desired regional area thicknesses of semiconductor layers or film of semiconductor devices and the accurate changes in the quantum size effects of thin layers for semiconductor devices, such as, for example, multiple wavelength laser arrays with emitters having different preselected individual operating wavelengths, semiconductor lasers with built-in index waveguides, window lasers, optical waveguides coupling opto-electronic devices on an integrated chip and GaAs wires.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

In describing the devices of this invention, reference is generally made to individual discrete structures although it is generally the case that a plurality of such devices would be fabricated on a wafer substrate in a MOCVD reactor wherein the processing laser beam would be scanned and/or modulated to selected locations to perform the desired induced evaporation enhancement in patterned fashion across the wafer surface. Also, many of the structures disclosed contain a separate confinement cavity for the active region for purposes of illustration and is not a specific requirement in the exercise of this invention. Further, many of the structures disclosed like those, for example, in FIGS. 2 and 2A without the need of stripe geometry, can also be employed as passive waveguides for below bandgap radiation waveguiding as well as laser structures by providing current injection through stripe geometry defined by proton bombardment or ion implant.

Figure 1:
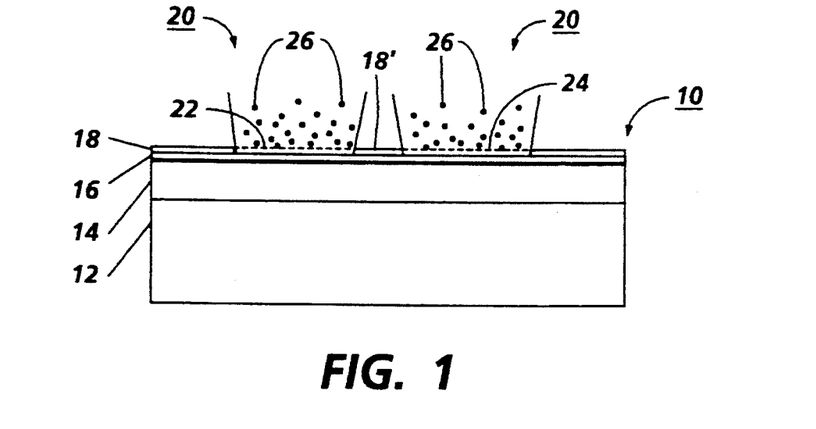
FIG. 1 is a schematic illustration of the process utilized to selectively modify in situ surface morphology of a semiconductor layer during or after its epitaxial growth.

Reference is now made to FIG. 1 wherein there is shown a schematic illustration of one aspect of the in situ process of U.S. Pat. No. 4,962,057 involving induced evaporation enhancement during in situ epitaxial growth. Structure 10 comprises a substrate or support 12, e.g., GaAs, upon which has been epitaxially deposited in MOCVD, layers 14, 16 and 18, for example, respectively, $Al_xGa_{1-x}As$, $Al_yGa_{1-y}As$ and GaAs. After growth of GaAs layer or film 18 is completed at about 800° C., a focussed laser beam 20 having an appropriate intensity profile to heat and selectively scan two regions 22 and 24 on the surface of active region 18 or, alternatively, beam 20 may fill the entire selected area in a quasi stationary manner and be slightly vibrated or oscillated such as via a galvanometer controlled mirror to spatially average any nonuniformity in its shaped intensity profile. In the regions 22 and 24 of film 18, GaAs is desorbed from the surface of the film in its vapor form as represented at 26. The temperature rise in regions 22 and 24 is estimated to be 200° C. so that the surface is approximately 1000° C. If continued for a sufficient period of time in a 1% arsine in $H_2$ ambient, e.g. 300 seconds for a GaAs layer 0.03 μm thick, regions 22 and 24 of layer 18 will be completely evaporated leaving an island or strip region 18' of GaAs. Negligible thinning occurs in the field outside of illuminated regions 22 and 24 during the process. This thinning is too infinitesimal to be of any concern relative to structure geometry or device characteristics.

After the desired selective evaporation of layer 18 has been completed, the substrate temperature is returned to about 800° C. for resumed MOCVD growth of Group III–V films and epitaxial growth is completed.

Figure 2:
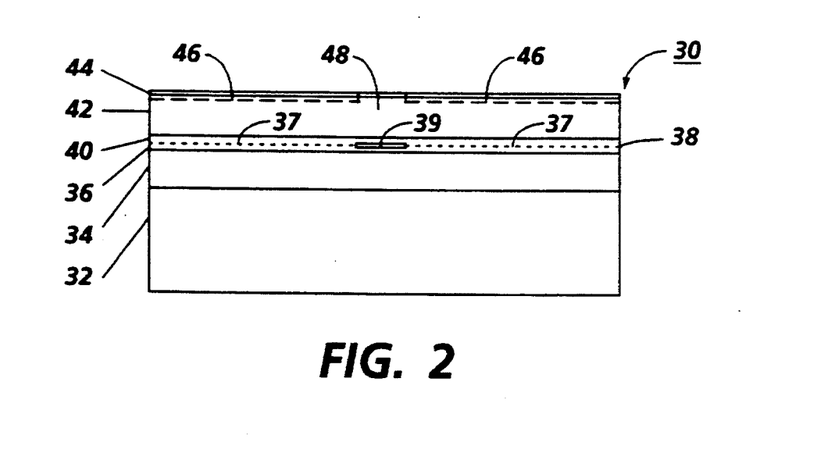
FIG. 2 is a schematic illustration of a buried stripe laser comprising this invention.
Figure 2A:
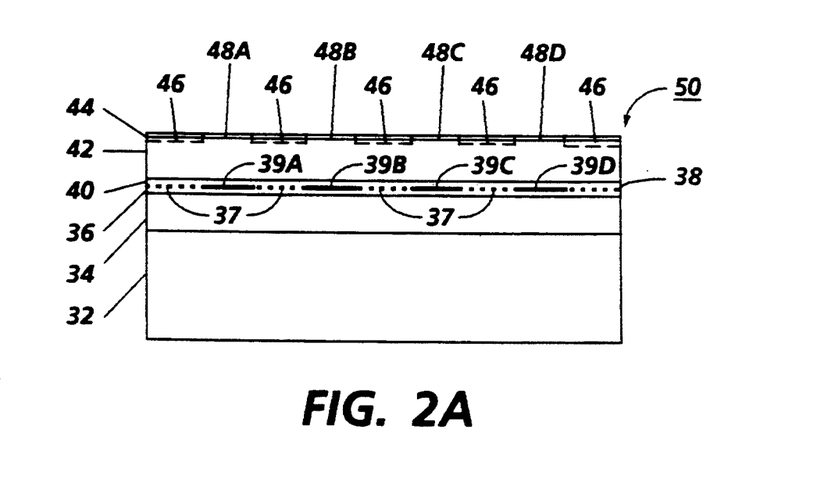
FIG. 2A is a schematic illustration of a buried stripe array laser comprising this invention.

FIGS. 2 and 2A illustrate possible laser structures employing the technique described in connection with FIG. 1 and detailed in patent application Ser. No. 07/354,052. In FIG. 2, single emitter heterojunction laser 30 comprises a buried active region in a separate confinement cavity and includes substrate 32 upon which are deposited the following layers employing the MOCVD reactor as illustrated and described in the above mentioned patent applications: an outer confinement layer 34 of n-$Al_xGa_{1-x}As$, an inner confinement layer of n-$Al_yGa_{1-y}As$ where $x>y$; a buried active region or regions 39 formed from a previously deposited layer 38 and created via enhanced evaporation of regions 37 of layer 38 or region or regions 39 formed during the deposition of layer 38 by matching the growth rate to the enhanced evaporation rate so that only region(s) 39 are ultimately deposited per se. Active region 39 may be undoped, or p-type doped or n-type doped and may comprise a relatively thin strip, double heterostructure (DH) buried active region or a single quantum well of either GaAs or $Al_zGa_{1-z}As$ where z is very small and $x>y>z$ or a multiple quantum well structure of alternating well layers of GaAs or $Al_zGa_{1-z}As$ and corresponding barrier layers of either AlAs or $Al_{z'}Ga_{1-z'}As$ where $x>y>z'>z$.

Once region 39 is formed, epitaxial growth is continued comprising inner confinement layer 40 of p-$Al_y Ga_{1-y}$ As followed by outer confinement layer 42 of p-$Al_xGa_{1-x}As$ and cap layer 44 of p+-GaAs. Proton bombarded or ion implanted regions 46 define current confinement stripe 48.

Array laser 50 in FIG. 2A is basically fabricated in the same manner as described in connection with laser 30 except that laser 50 is a multiple emitter laser comprising four emitters instead of a single emitter. Therefore, like components carry the same numerical identification, as the description for FIG. 2 equally applies to FIG. 2A except that multiple patterned regions 37 are produced via laser beam 20 to form the several buried active regions 39A–39D as well as the formation of corresponding current confinement 48A–48D.

From the forgoing discussion, it can be seen the ease and simplicity with which buried active regions 39 may be formed in situ without any necessity of removing the structure from the MOCVD reactor or providing special masking techniques to prepare buried active region 39. A distinct advantage of laser array 50 is that the structure provides for low optical loss coupling between region emitters 39. Further, index waveguiding is somewhat enhanced due to the removal of or prevention of growth of the active region 38 between regions or emitters 39.

Figure 3A:
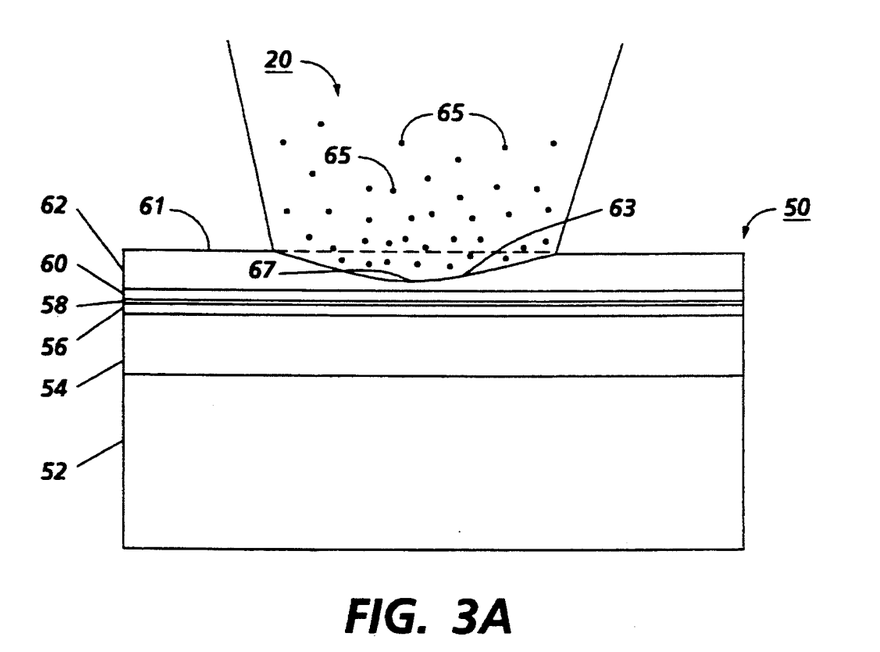
FIG. 3A is a schematic illustration of a nonplanar cladding region to function as an index waveguide or index antiguide.
Figure 3B:
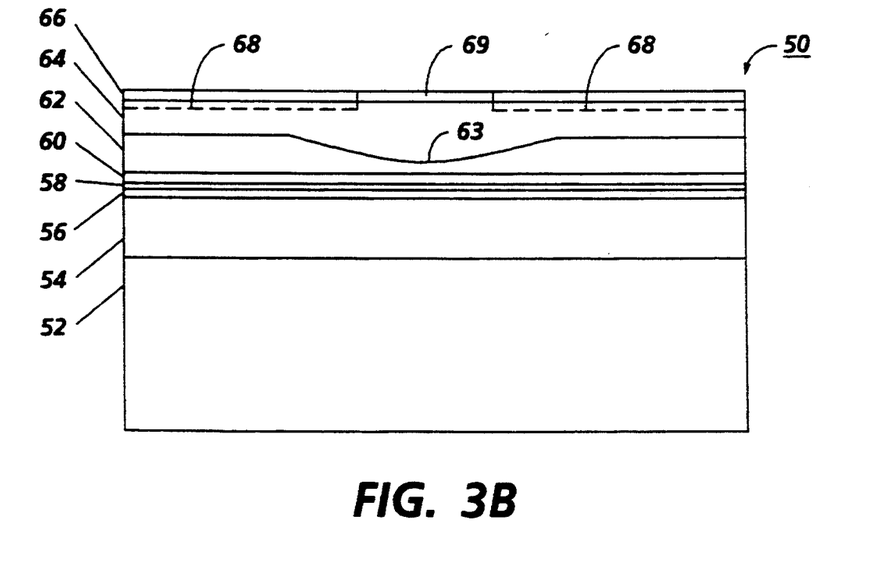
FIG. 3B is a schematic illustration of a completed heterojunction laser of FIG. 3A having nonplanar cladding region to function as an index waveguide, which may function as a focussing or diverging guide.
Figure 3C:
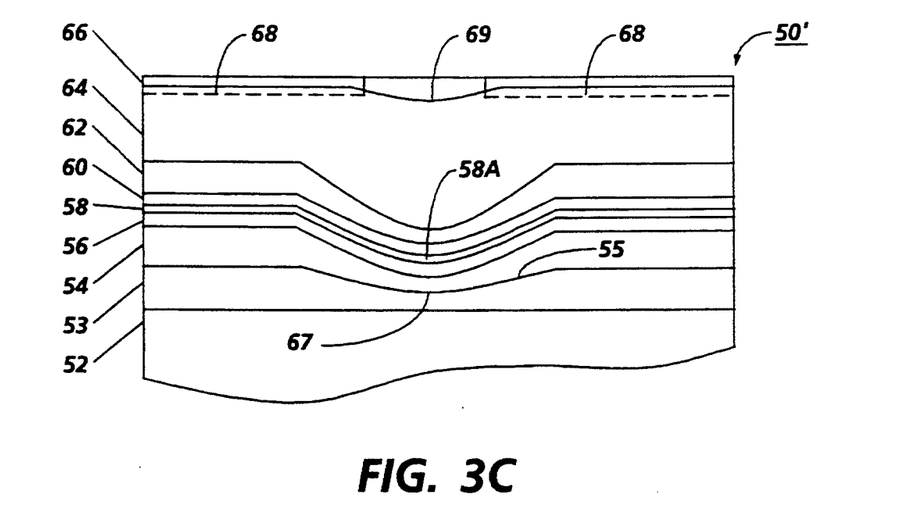
FIG. 3C is a schematic illustration of a modified form of the heterojunction laser of FIG. 3B containing a dual nonplanar cladding region on adjacent sides of the active region to function as an index waveguide or index antiguide.

Reference is now made to FIGS. 3A–3C wherein built-in refractive index waveguiding structures are illustrated. In this figures, the concave curvature of the layers has been exaggerated for purposes of clarity. As shown in FIG. 3A, laser structure 50 includes a separate confinement cavity and comprises substrate 52 upon which the following layers are deposited employing MOCVD: an outer confinement layer 54 of n-$Al_xGa_{1-x}As$; an inner confinement layer 56 of n-$Al_yGa_{1-y}As$ where $x>y$; an active region 58 of undoped, or p-type doped or n-type doped region and may comprise a relatively thin conventional active layer or a single quantum well of either GaAs or $Al_zGa_{1-z}As$ where $x>y>z$ or a multiple quantum well structure of alternating well layers of GaAs or $Al_zGa_{1-z}As$ and corresponding barrier layers of either AlAs or $Al_{z'}Ga_{1-z'}As$ where $x>y>z'>z$; an inner confinement layer 60 of p-$Al_yGa_{1-y}As$ and a first outer confinement layer 62 of p-$Al_AGa_{1-A}As$ where $x \geq A > y > z' > z$. At this stage of growth of structure 50, growth is temporary discontinued and beam 20 is focussed to surface 61 of confinement layer 62 to provide a temperature gradient sufficient to induce the desorption of $Al_AGa_{1-A}$ As from surface 61 as indicated at 65. Approximately 100 nm of material would be removed to provide an effective index waveguide or index antiguiding mechanism. As a result, a thinned region 63 is produced having a continuous spatial variation in thickness in the lateral direction wherein layer 61 will be its thinnest at point 67 and smoothly increase in thickness toward the outer boundaries of beam 20. This contour is due to the selected intensity shape of beam 20. Beam 20 is scanned in a direction out of the plane of FIG. 3A so that an elongated contour shape 63 is formed in layer 62.

After completion of the deformed region 63, epitaxial growth is continued in the MOCVD reactor with the growth of the second outer confinement layer 64 of $Al_BGa_{1-B}As$ where $x \geq A \geq B > y > z' > z$, followed by cap layer 66 of p+-GaAs. This structure could also serve as a passive waveguide for below bandgap radiation waveguiding. Proton bombardment or ion implant is utilized to form regions 68 and current confinement stripe 69.

As a specific example for laser structure 50 of FIG. 3B, layer 62 may be comprised of $Al_{0.8}Ga_{0.2}As$ and layer 64 may be comprised of $Al_{0.4}Ga_{0.6}As$. This structure provides for an index guide that has emphasis on lateral waveguiding properties. On the other hand, with $B>A$, an antiguiding structure is formed, e.g., layer 62 may be $Al_{0.1}Ga_{0.9}As$ and layer 64 may be $Al_{0.8}Ga_{0.2}As$. This antiguiding structure enables high power operation in a stable spatial mode by spreading optical power across a large lateral dimension at the laser output facet or near field.

In FIG. 3C, the index guided laser 50' is similar in structure to laser 50 except that there is provided buffer/confinement layer 53 and, further, prior to the growth of outer confinement layer 54, beam 20 is scanned to form a shallow, thinned region 55 in layer 53 which provides for a second lower confinement layer 53, comprising p-$Al_wGa_{1-w}As$, to have a monotonically decreasing spatial thickness variation extending from central point 67 to the outer boundaries of the original planar extent of layer 53. Growth of layers 54–64 is then completed in the manner as previously explained. As a result, the shallow concave region 55 is replicated through each of these layers but over the extent of thicker layers, such as layers 62 and 64, will begin to dissipate.

The Al composition for the cladding region of laser 50' must be appropriately chosen so that each concave region in layers above concave region 55 will function as a guide or an antiguide. If an index guide, than its function will be that of a focussing waveguide. If an index antiguide, then its function will be that of a diverging guide. In this connection, the molar fraction, w, for layer 53 may be equal or substantially the same as the molar fraction, B, for layer 64 and molar fraction, x, for layer 54 may be equal to or nearly the same as the molar fraction, A, for layer 62 as compared to the molar fraction, B, for layer 64. In any case, the enlarged region of layers 53, 54, 62 and 64 may function as a waveguiding mechanism or as an antiguiding mechanism depending upon the Al content of these layers and their effective refractive index.

To be noted is that if the Al content in layers 53 and 64 is greater than the Al content in layers 54 and 62, i.e., W, B>X, A, then the effective refractive index is such that the spatial mode or modal electric field of the propagating radiation will be effected more by the comparatively lower index properties of layers 53 and 64 and in combination provide an index antiguiding mechanism. This causes divergence of radiation out of active region 58A and is useful in applications requiring large beam spot sizes. On the other hand, if the Al content in layers 53 and 64 is less than the Al content in layers 54 and 62, i.e., X, A>W, B, then the effective refractive index is such that the spatial mode of the propagating radiation will be effected more by the comparatively higher index properties of layers 53 and 64 and in combination provide an index waveguiding mechanism. This causes focussing of radiation in active region 58A and is useful in applications requiring focussed small beam spot sizes. An interesting variation of both of the foregoing mechanisms would be, for example, B>A and X>W so that layers 62 and 64 would function as an index antiguiding mechanism and layers 53 and 54 would function as an index waveguiding mechanism in the particular embodiment shown.

Figure 4A:
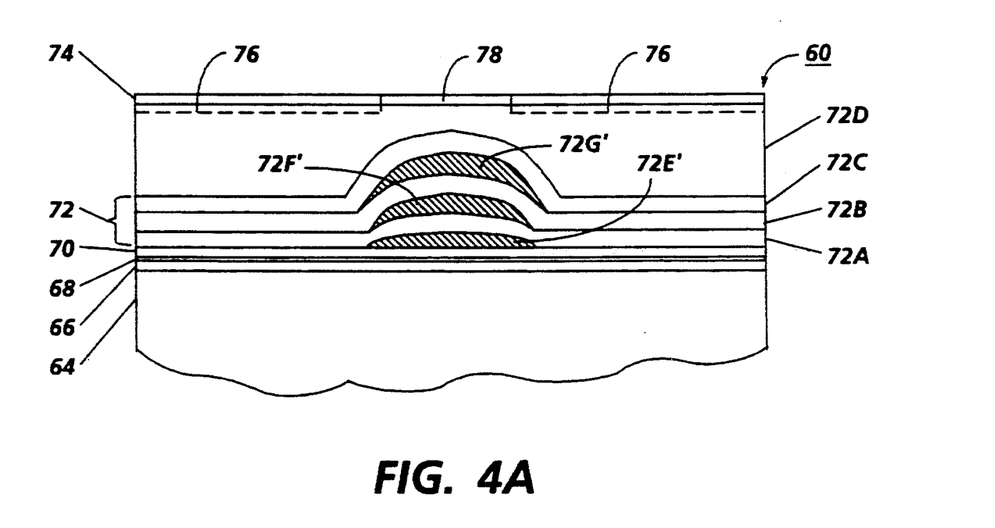
FIG. 4A is a schematic illustration of a quantum well heterostructure laser with a buried superlattice in a cladding region of the laser to function as an index waveguide.

FIG. 4A discloses an index waveguide mechanism built into the confinement region of the laser structure employing induced evaporation enhancement. This mechanism is shown in exaggerated for in order to discuss its nature and function and disclose distinguishing featural changes relative to the embodiments of FIGS. 4A and 4B. In reality, the layers comprising the index waveguide mechanism may of the quantum size effect forming a superlattice but such a structure is by choice and not a requirement.

Laser 60 comprises a plurality of semiconductor layers deposited on a semiconductor support which may be an outer confinement layer 64 of n-$Al_xGa_{1-x}As$; an inner confinement layer 66 of n-$Al_yGa_{1-y}As$ where x>y; an active region 68 of undoped, or p-type doped or n-type doped region and may comprise a relatively thin conventional active layer or a single quantum well of either GaAs or $Al_zGa_{1-z}As$ where x>y>z or a multiple quantum well structure of alternating well layers of GaAs or $Al_zGa_{1-z}As$ and corresponding barrier layers of either AlAs or $Al_{z'}Ga_{1-z'}As$ where x>y>z'>z and an inner confinement layer 70 of p-$Al_yGa_{1-y}As$.

After the growth of inner confinement layer 70, a superlattice confinement region 72 is grown comprising layers 72A, 72B, 72C and 72D of p-$Al_AGa_{1-A}As$ containing buried regions 72E, 72F, 72G and 72H of GaAs or p-$Al_BGa_{1-B}As$ wherein B>A. Growth is accomplished specifically as follows. After the growth of inner confinement layer 70, layer 72E is epitaxially deposited. Upon the completion of the growth of layer 72E, a broad laser beam 20 having monotonically changing intensity profile, which is of highest intensity at beam center, is focussed and scanned or oscillated to remove all portions of layer 72E outside of the region of the layer forming elongated strip region 72E'. In performing this function, the curved intensity profile of broad beam 20 will also monotonically remove a portion of the surface of strip region 72E' providing the resultant somewhat convex shape as shown in FIG. 4A. After the removal of these portions of layer 72E, epitaxial growth is continued with the growth of layer 72A and thence layer 72F followed, again, by the selective removal of adjacent layer portions as in the case of previously deposited of layer 72E. This process is repeated for respective layers 72B, 72G and 72C, 72H. Epitaxial growth is completed by the final confinement layer 72D and cap layer 74 of p+-GaAs. Current confinement is accomplished by proton bombardment or ion implant in region 78 defining current confinement stripe 78.

Figure 4B:
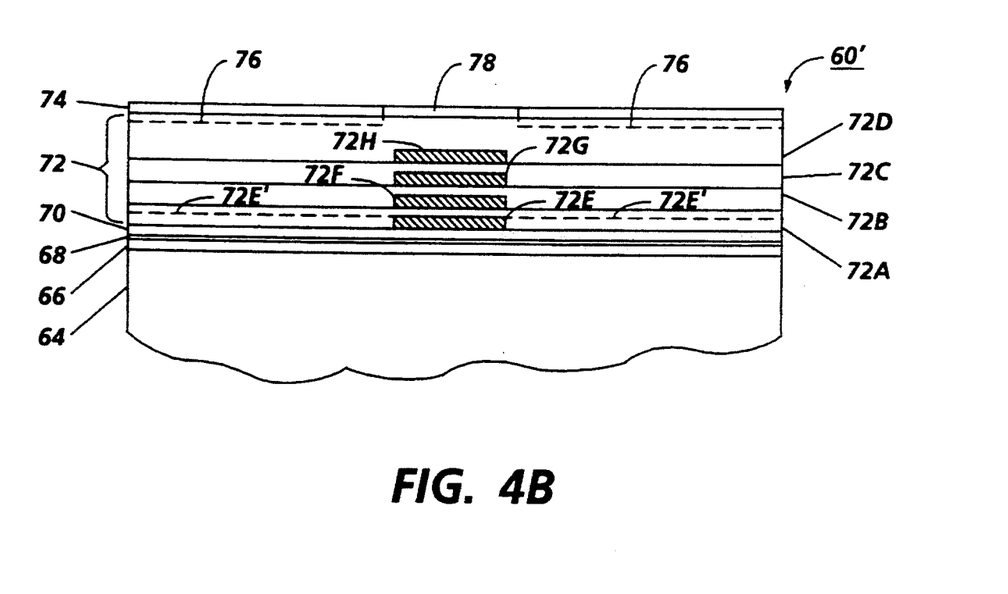
FIG. 4B is a schematic illustration of another quantum well heterostructure laser with a buried superlattice in a cladding region of the laser to function as an index waveguide.

FIG. 4B discloses another embodiment with an index waveguide mechanism built into the confinement region of the laser structure. However in this structure, laser beam 20 employed in desorption processing is fine tuned, i.e.; the optical processing beam is reduced in size so that featural changes in desorbed regions can be defined in more abrupt appearance due to the use of a smaller beam size. Therefore, similar parts in FIG. 4B carry the same numeral identification as those parts found in FIG. 4A.

Laser 60' comprises a plurality of semiconductor layers deposited on a semiconductor support which may be an outer confinement layer 64 of n-$Al_xGa_{1-x}As$; an inner confinement layer 66 of n-$Al_yGa_{1-y}As$ where x>y; an active region 68 of undoped, or p-type doped or n-type doped region and may comprise a relatively thin conventional active layer or a single quantum well of either GaAs or $Al_zGa_{1-z}As$ where x>y>z or a multiple quantum well structure of alternating well layers of GaAs or $Al_zGa_{1-z}As$ and corresponding barrier layers of either AlAs or $Al_{z'}Ga_{1-z'}As$ where x>y>z'>z and an inner confinement layer 70 of p-$Al_yGa_{1-y}As$.

After the growth of inner confinement layer 70, a superlattice confinement region 72 is grown comprising layers 72A, 72B, 72C and 72D of p-$Al_AGa_{1-A}As$ containing buried regions 72E, 72F, 72G and 72H of GaAs or p-$Al_BGa_{1-B}As$ wherein B>A. Growth is accomplished specifically as follows. After the growth of inner confinement layer 70, layer 72E is epitaxially deposited. Upon the completion of the growth of layer 72E, a narrow beam 20 having a fairly flat intensity profile is focussed and scanned or oscillated to remove all portions 72E' of layer 72E outside of the region of the layer forming elongated strip region 72E. The removed portions 72E' are indicated as dotted lines in FIG. 4A. After the removal of portions 72E', epitaxial growth is continued with the growth of layer 72A and thence layer 72F followed, again, by the selective removal of adjacent layer portions as in the case of adjacent portions 72E' of layer 72E. This process is repeated for respective layers 72B, 72G and 72C, 72H. Epitaxial growth is completed by the final confinement layer 72D and cap layer 74 of p+-GaAs. Current confinement is accomplished by proton bombardment or ion implant in region 78 defining current confinement stripe 78.

It should be understood relative to FIGS. 4A and 4B that it is not required that all of outside portions of strip regions 72E–72H, such as portions 72E', need be completely removed to the surface of the layer 72A–72D therebeneath, as small surface areas of these layers may remain. Also, strips 72E–72H and their removed layer portions may also be GaAs rather than AlGaAs. As another alternative, the portions of layers 72A–72C immediately above strip regions 72E–72H may be thinned or completely removed via induced evaporation enhancement after their growth forming a fairly continuous high refractive index integrated region of GaAs or AlGaAs, whatever the case may be.

Further, it should be understood that in connection with FIGS. 4A and 4B, only one strip region 72E is sufficient to provide index waveguiding properties. However, several such strip regions provides for stronger waveguiding properties.

As a specific example of index guided laser 60, active region 68 may comprise a single quantum well of GaAs, strips 72E–72H may comprise $Al_{0.07}Ga_{0.93}As$ and 72A–72D may comprise $Al_{0.8}Ga_{0.2}As$. Portions of the $Al_{0.07}Ga_{0.93}As$ layers outside of strips 72E–72H have been removed by induced evaporation enhancement. The resulting index of refraction change in the superlattice confinement region 72 gives rise to real refractive index guiding of the lightwave propagation centered therebeneath in active region 68 including optical confinement layers 66 and 70. Index waveguiding mechanism 72 may also be employed, with or without layer 72', in the region of confinement layer 64 on the opposite side of active region 68.

Figure 5:
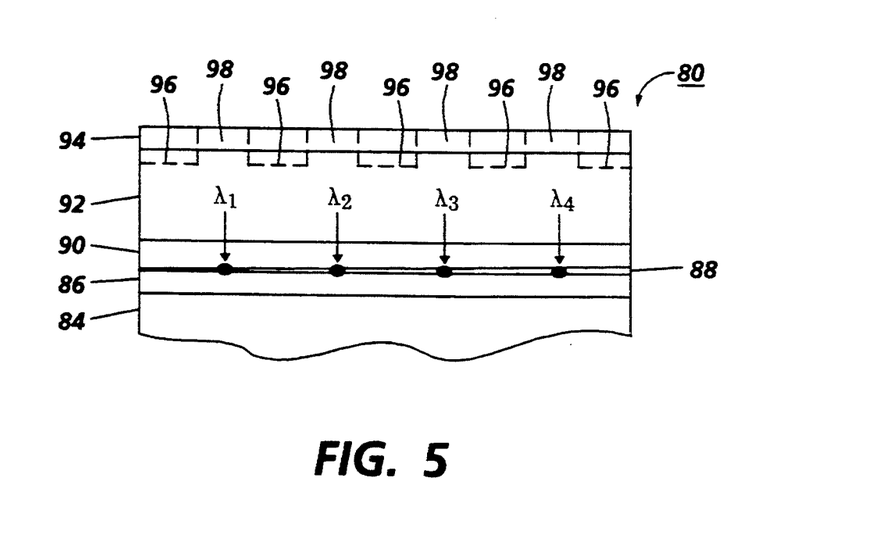
FIGS. 5 is a schematic illustration of a multiple wavelength emitter laser array comprising this invention.
Figure 6:
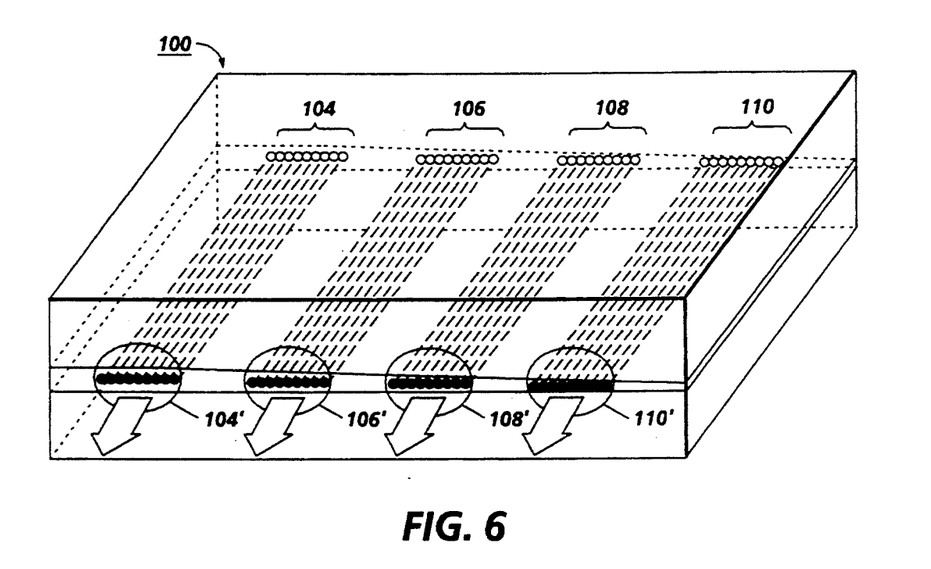
FIG. 6 is a schematic perspective view of a multiple wavelength multi-array laser.
Figure 7:
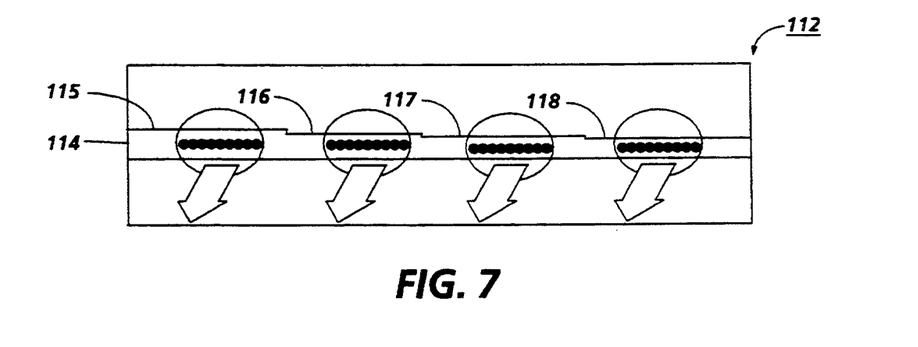
FIG. 7 is a schematic illustration of a multiple wavelength, multi-array laser with a stepped active region.

Reference is now made to the multi-wavelength array lasers of FIGS. 5–7. In FIG. 5, multi-emitter, multi-wavelength array laser 80 comprises an outer confinement layer 84 of $n-Al_xGa_{1-x}As$; an inner confinement layer 86 of $n-Al_yGa_{1-y}As$ where $x>y$; an active region 88 of undoped, or p-type doped or n-type doped region and may comprise a relatively thin conventional active layer or a single quantum well of either GaAs or $Al_zGa_{1-z}As$ where $x>y>z$ or a multiple quantum well structure of alternating well layers of GaAs or $Al_zGa_{1-z}As$ and corresponding barrier layers of either AlAs or $Al_{z'}Ga_{1-z'}As$ where $x>y>z>z$; an inner confinement layer 90 of $p-Al_yGa_{1-y}As$ and a first outer confinement layer 92 of $p-Al_AGa_{1-A}As$ where $x≧A>y>z'>z$ and cap layer 94 of p+-GaAs. Current confinement is accomplished by proton bombardment or ion implant in regions 96 forming a series of current confinement stripes 98.

To be noted is that active region 88 has a monotonically increasing layer thickness from left to right in FIG. 5 which is performed during the growth of this region employing induced evaporation enhancement as taught in patent application Ser. No. 07/257,498. This monotonically changing region may be fabricated using two different approaches in the MOCVD reactor, one employing a large beam spot having a stepped intensity beam profile and the other using a movable mask. The resulting lateral variation in active region thickness provides for a corresponding lateral variation in gain density and, therefore, a corresponding lateral variation in the wavelength output, $λ_1$, $λ_2$, $λ_3$ and $λ_4$. This multi-wavelength array laser 80 has applications in electronic printing systems and optical communication systems.

In FIGS. 6 and 7, multi-wavelength, multi-array laser structures are disclosed that provide emission with different bandwidths centered at different wavelengths.

In FIG. 6, multi-wavelength, multi-array laser 100 includes an active region 102 having spatial thickness variation thereacross and comprises four array laser groups 104, 106, 108 and 110 of nine emitters each. In view of the spatial thickness variation in region 102, the four array laser groups 104–110 each characteristically provide multiple wavelength emission centered at four different wavelengths. This multi-wavelength, multi-array laser 100 has application in optical multi-wavelength communications.

FIG. 7 represents an alternative embodiment of laser 100 in FIG. 6 wherein multi-wavelength, multi-array laser 112 includes an active region 114 which varies monotonically in thickness in a stepped fashion rather than continuously as in FIG. 6. This stepped change along the upper surface of region 114 may be accomplished after its growth with patterned induced evaporation enhancement wherein the dwell time of the scanning beam 20 would be progressively greater sequentially from region to region per regions 115, 116, 117 and 118. In the case here, the individual bandwidths of the separate array laser groups would not be as large as the bandwidths found in multi-array laser 100 because the monotonically thickness change occurring in the active region of the latter whereas in multi-array laser 112, there is no such monotonical change in the separate array laser groups. It can be envisioned that if the monotonical thickness changes in the active region across an individual array laser group are significant incremental steps of change, the output for such an array group would become multiple wavelength with each emitter providing a dominate wavelength of its own.

Figure 8:
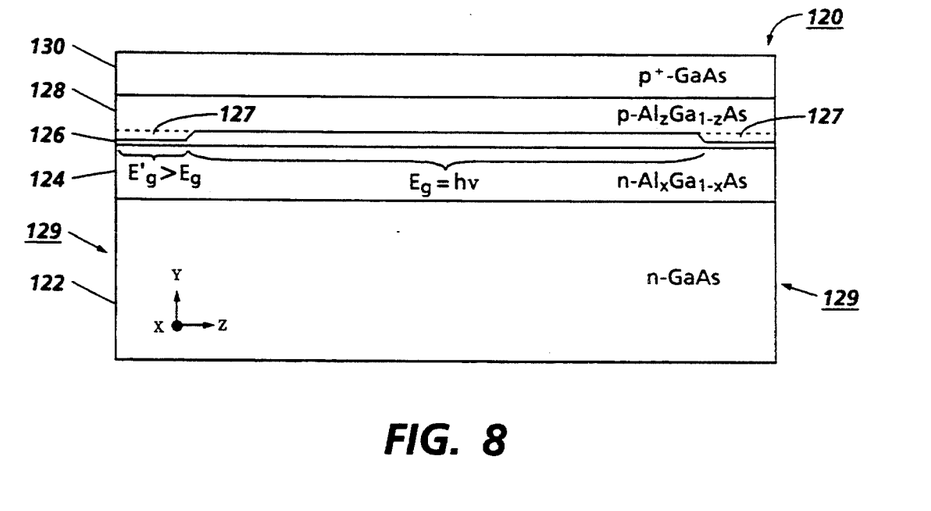
FIG. 8 is a schematic illustration of a longitudinal side elevation of a heterostructure laser with transparent window regions.

Laser 120 in FIG. 8 is known in the art as window laser and may be comprised of one or more adjacently disposed emitters. Laser 120 comprises a substrate 122 upon which are deposited the following layers or regions employing the MOCVD reactor shown in FIG. 1: a cladding layer 124 of $n-Al_xGa_{1-x}As$; an active region 126 being undoped, or p-type doped or n-type doped and can comprise a relatively thin conventional double heterostructure (DH) active layer or a single quantum well of either GaAs or $Al_yGa_{1-y}As$ where y is very small and $x>y$ or a multiple quantum well structure of alternating well layers of GaAs or $Al_yGa_{1-y}As$ and corresponding barrier layers of either AlAs or $Al_{y'}Ga_{1-y'}As$, where x, $y'>y$ or a separate single or multiple quantum well structure in a separate confinement cavity; a cladding layer 128 of $p-Al_zGa_{1-z}As$ where x, z, $y'>y$; and a cap layer 130 of p+ GaAs. Fabrication of these layers is continuous through the growth of layer 126 at which time epitaxial growth is interrupted, the TMG source to the MOCVD chamber is turned off, the substrate temperature is increased to 825° C. and radiation beam is focused to an elongated region 127 at both ends of layer 126 and scanned in the X direction perpendicular to the plane of FIG. 8 for a period of time, e.g., at 1 Å/second, sufficient to thermally evaporate a portion of layer 126 in regions 127. The temperature at region 127 during the evaporation process in the As/H attending environment may be about 1000° C. to 1030° C. After the removal of a portion of GaAs regions 127, epitaxial growth is continued with the deposition of layers 128 and 130. Thinned regions 127 form transparent, passive waveguides which are nonabsorbing to propagating radiation to mirror facets 129.

Figure 9:
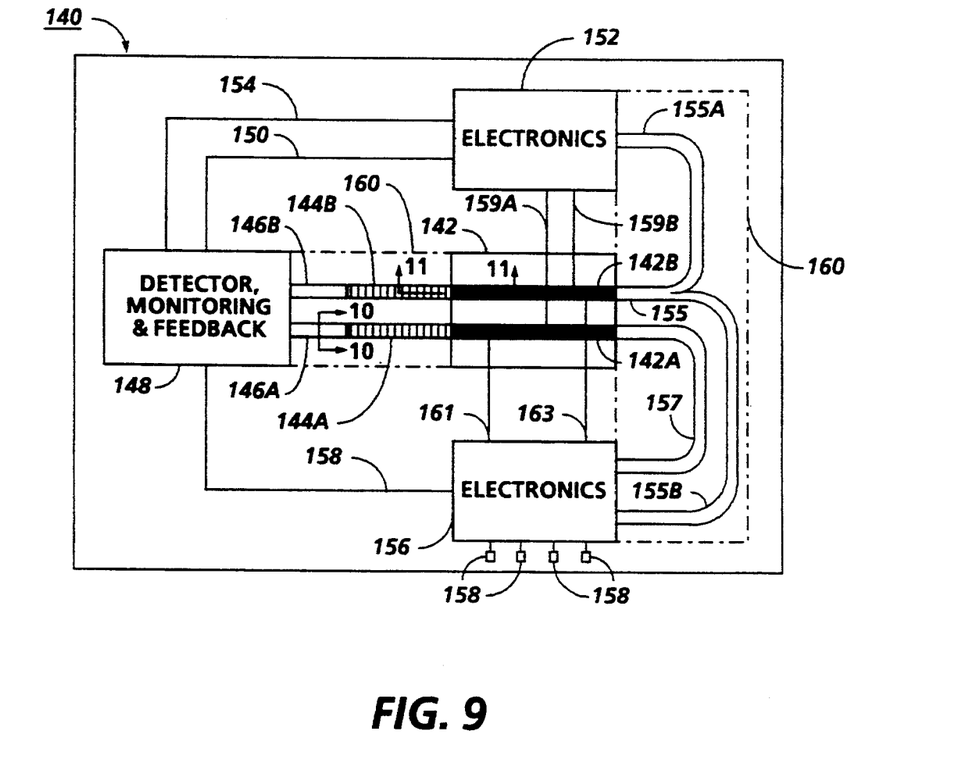
FIG. 9 is a schematic illustration of an integrated chip which includes a dual laser device with DFB and optical waveguide branching.
Figure 10:
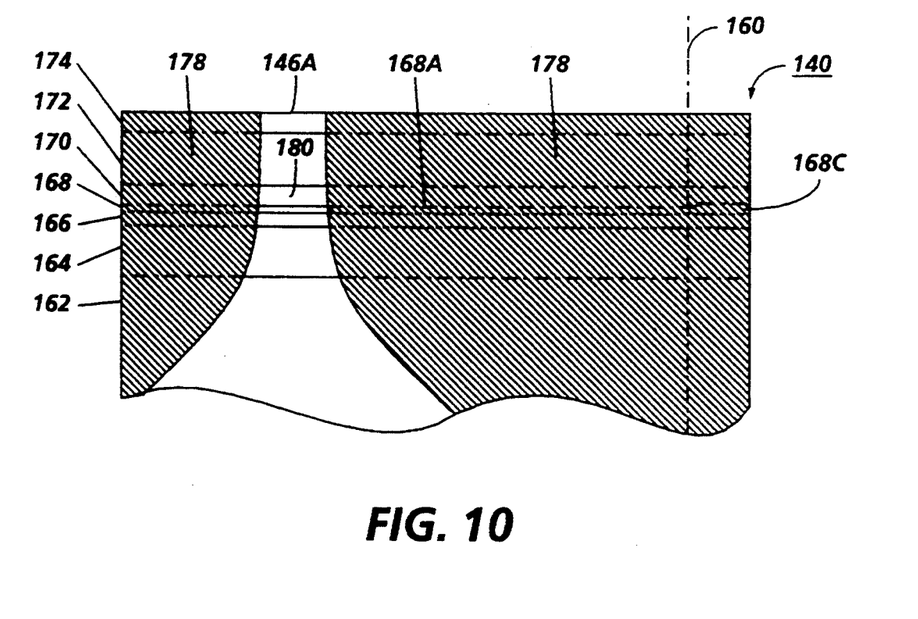
FIG. 10 is a schematic illustration of a cross section taken along the line 10—10 of FIG. 9.
Figure 11:
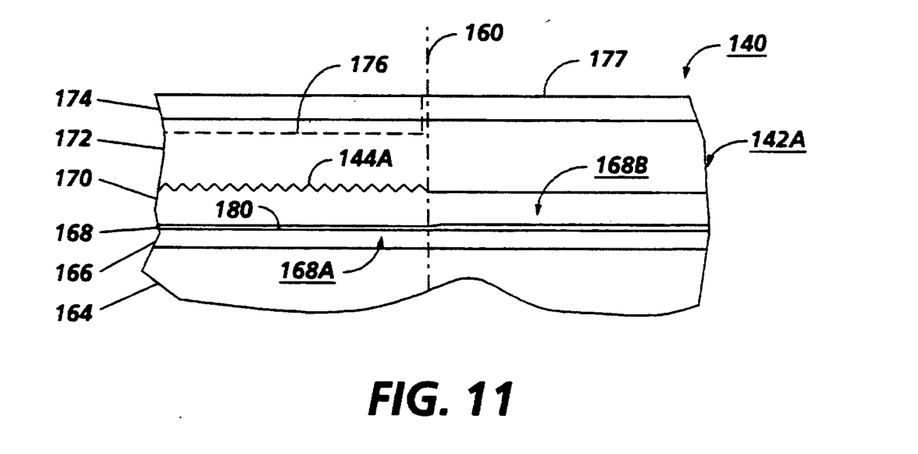
FIG. 11 is a schematic illustration of a cross sectional elevation taken along the line 11—11 of FIG. 9.

Optically nonabsorbing waveguides may be patterned in the fabrication of an electro-optic integrated chip 140 employing induced evaporation enhancement as illustrated in FIGS. 9–11. Chip 140 includes a dual beam laser 142 central of the chip having laser emitters 142A and 142B. Optical feedback is provided via DFBs 144A and 144B respectively integrated with the optical cavities of lasers 142A and 142B for coupling light propagation back into the laser optical cavities. The opposite ends of DFBs 144 are optically coupled to detector, monitoring and feedback circuit 148 via integrated waveguides 146A and 146B. Circuit 148 also provides, for example, feedback information via line or lines 150 to electronic circuitry 152 for the adjustment of the optical output level to maintain uniform intensity of laser emitters 142A and 142B. Circuit 152 is electrically coupled to the contact stripes of respective emitters 142A and 142B via lines 159A and 159B. Circuit 148 may also include connections to circuitry 152 via line or lines 154 to provide signal processing relative to its optical output via integrated optical waveguide 155 from the forward output of laser emitter 142B.

It should be noted that lines 150, 154, 158, 159, as well as lines 161,163 and output pads 158 to be discussed later, may be comprised of buried GaAs conductive wires of the type discussed and disclosed in FIG. 12 herein formed with selective induce evaporation and integrated to connecting circuitry.

Waveguide 155 comprises to branches 155A and 155B wherein branch 155A is optically coupled to circuitry 152 while branch 155B is optically coupled to a first optical input of circuitry 156. The output of laser emitter 142A is optically coupled via integrated optical waveguide 157 to a second optical input of circuitry 156. The optical waveguides 155 and 157 are 180° radius to reach the inputs to circuitry 152 and 156 and are low loss, nonabsorbing waveguides due to the employment of induced evaporation enhancement. This processing renders it possible to provide for compact opto-electronic integrated circuitry wherein circuitry 152 and 156 need not be in direct alignment or in substantial alignment with the forward output of emitters 142A and 142B forming a large elongated structure. Rather, these integrated optical devices may be formed abreast of laser structure 142 with the optical coupling patterned by forming high refractive index waveguide structures employing induced evaporation enhancement during chip fabrication.

It should be noted that in connection with the structure of FIG. 9, if region 160 that includes waveguides 155 and 157 were eliminated in the fabrication process, the optical mission from laser emitters 142A and 142B may be taken as an external output for application as a multispot emitter in a laser printer.

Circuitry 156 may also be connected to feedback circuit 148 via line 158 as well as coupled to emitters 142A and 142B via contact lines 161 and 163 to modulate their output with circuitry 152 providing a differential determinative bias to emitters 142A and 142B insuring that the output power and intensity of the emitters is maintained at a predetermined level. Circuitry 156 may have connection to the outside world via contact pads 158 through which processed electronic signals or timing signals may be provided as an output and a modulated signal for processing may be provided as an input to emitters 142A and 142B via contact lines 161 and 163.

FIGS. 10 and 11 provide cross sectional detail of the structure of integrated chip 140 and, in particular, details relating to the optical waveguide construction (FIG. 10) and the DFB/laser emitter construction (FIG. 11). FIG. 10 also is representative of a cross section of optical waveguides 155 and 157. As disclosed in both FIGS. 10 and 11, chip 140 includes a substrate 162 of n-GaAs, or Si with appropriate buffer layer, upon which is epitaxially deposited an outer confinement layer 164 of n-Al$_x$Ga$_{1-x}$As; an inner confinement layer 166 of n-Al$_y$Ga$_{1-y}$As where x>y; an active region 168 of undoped, or p-type doped or n-type doped region and may comprise a relatively thin conventional active layer or a single quantum well of either GaAs or Al$_z$Ga$_{1-z}$As where x>y>z or a multiple quantum well structure of alternating well layers of GaAs or Al$_z$Ga$_{1-z}$As and corresponding barrier layers of either AlAs or Al$_{z'}$Ga$_{1-z'}$As where x>y>z'>z; an inner confinement layer 170 of p-Al$_y$Ga$_{1-y}$As and a first outer confinement layer 172 of p-Al$_A$Ga$_{1-A}$As where x≧A>y>z'>z and cap layer 174 of p+-GaAs. Current confinement is accomplished by proton bombardment or ion implant in region 176 forming current confinement stripe 177.

With reference to all three FIGS. 9–11, sections identified at 160 contain features for the formed transparent waveguides 146, 155 and 157 and DBRs 144. A portion of active region 168 in these sections 160 is removed by induced evaporation enhancement after the growth of region 168, as clearly depicted in FIGS. 10 and 11 at 168A, leaving remaining sections 168B (FIG. 11) and 168C (FIG. 10) of active region 168 at original growth thickness. This removal provides for the optically confined regions to be transparent to propagation in the same manner as the window regions 127 in window laser 120 of FIG. 8, i.e., E'g is slightly larger than Eg.

As illustrated in FIG. 10, the optical waveguide confinement is brought about by impurity induced layer disordering after crystal growth wherein the integrity of the deposited layers in regions 178 of at least sections 160 are disordered by, for example, Si diffusion at about 850° C., so that a transparent waveguide 180, such as at 144, 155 and 157, is formed in chip 140. Alternatively, the optical confinement can also be obtained by eliminating layer 168A outside of the desired optical channel 180 in the manner described in connection with FIG. 2 in the removal of regions 37. With this removal, the disordering at regions 178 would not then be necessary.

FIG. 11 illustrates the coupling region between active region 168B of laser emitter 142A and transparent waveguide 180 in active region 168A of DFB 144A. DFB 144 is produced via induced evaporation enhancement by employing a micromask of periodic thin slits or the use of the interference pattern developed from two laser beams of appropriate wavelength derived from the same laser source and exposing this portion of chip 140 immediately after the growth of inner confinement layer 170 with beam 20 to produce the DFB grating. After the grading is completed, epitaxial growth of layers 172 and 174 is completed. Appropriate proton bombardment or ion implant regions 176 are provided to define the current confinement region 177 of emitter 142A as well as the current confinement region for adjacent emitter 142B.

It will be appreciated by those skilled in the art that waveguide 180 can also be fabricated as a buried waveguide region as taught in U.S. Pat. No. 4,802,182. In such a case, waveguide 180 may be a buried 3-D optically transparent cavity or wire for routing the optical signals between dualbeam laser emitters 142 and circuit 148 as well as circuitry 152 and 156.

Thus, the process of fabricating chip 140 entails two in situ interruptions in growth to apply selective desorption techniques with respect to active region portions 168A after growth of active region 168 and DFB gratings 144A and 144B after growth of inner confinement layer 170 followed by impurity induced disordering as shown at 178.

Figure 12:
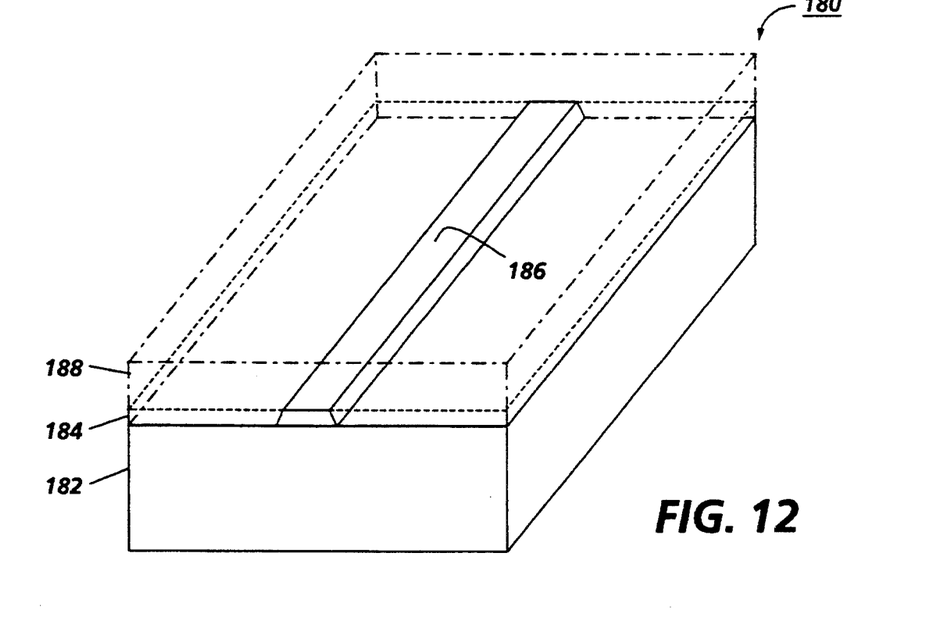
FIG. 12 is a GaAs conducting wire surrounded by an insulating medium.

FIG. 12 illustrates the application of induced evaporation enhancement in MOCVD in the fabrication of quantum well wires and boxes without the need of any masking techniques as exemplified in U.S. Pat. No. 4,751,194, or the use of combination photolithography and chemical etching procedures. Structure 180 comprises a p-GaAs substrate or support 182 having insulating characteristics, via, for example, semiconductor defect implantation, upon which has been epitaxially deposited a GaAs layer 184 having thickness in the range of 10–30 nm. At this stage of growth, beam 20 is brought into focus and scanned in a manner illustrated in FIG. 1 to form a quantum well wire 186 of GaAs, having submicron width dimensions, for example, in the range of 10 nm to 50 nm. Follow the formation of wire 186, layer 188 is deposited to cover wire 186. The epitaxial growth of layer 188 may be either p-GaAs or p-$Al_xGa_{1-x}As$ having insulating characteristics or may be undoped GaAs or undoped $Al_xGa_{1-x}As$. GaAs layer 188 or support 182 may be doped with a deep trap dopant to provide for insulating characteristics. Such a buried submicron wire or box structure 186 may be utilized as an electrical conductor in integrated GaAs-/AlGaAs chip circuitry or as an active region in a diode laser structure.

Figure 13:
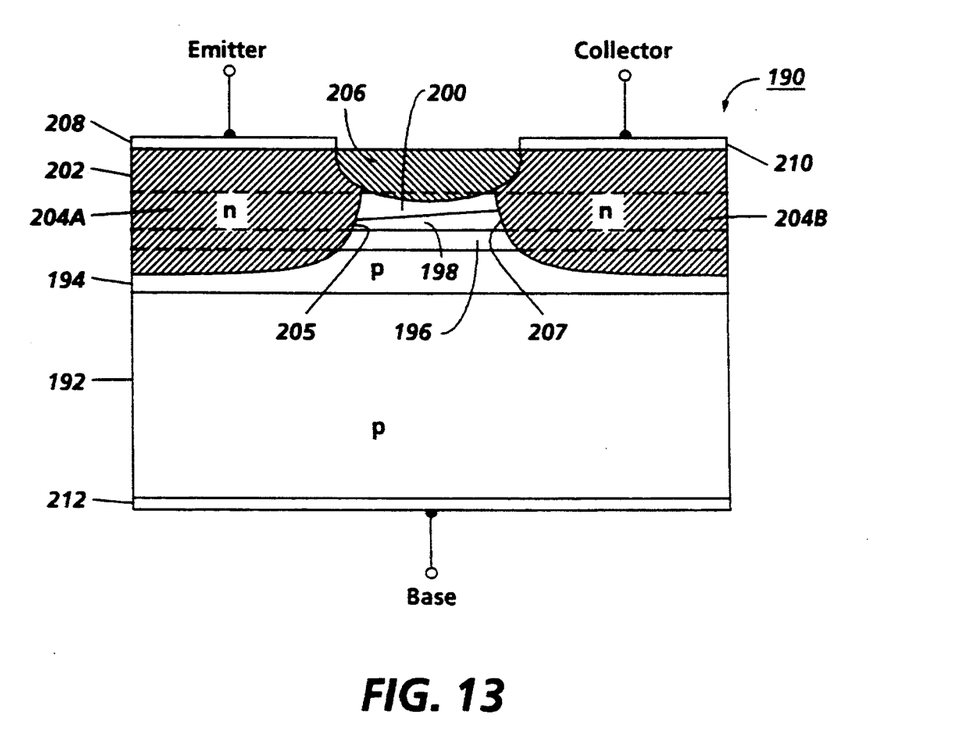
FIG. 13 is a schematic illustration of a side elevation of a lateral n-p-n heterojunction bipolar transistor.

The structure shown in FIG. 13 comprises a lateral heterojunction bipolar transistor 190. U.S. Pat. No. 4,987,468, which is incorporated herein by reference thereto and is assigned to the same assignee herein, discloses such a transistor construction wherein the emitter and collector regions form p-n heterojunctions at the emitter/base junction 205 and at the collector/base junction 207 with a planar base region wherein these regions are formed by impurity induced layer disordering (IILD) to produce emitter and collector regions of wider bandgap than the planar base region. For this structure as presently designed, current gains higher than reported in U.S. Pat. No. 4,987,468 require the base region length to be less than 0.75 μm. Calculations indicate that a gain of 100 or greater may be realized of the base can be reduced to less than about 0.5 μm. To improve the current gain and speed for a fixed base region length, a quantum well sized base region is employed having a lateral grading in its thickness as illustrated at 198 in FIG. 13. This lateral thickness grading is performed in the same manner as the lateral grading thickness in active layer 88 in FIG. 5.

Transistor 190 comprises a semiconductor support 192 which may be a semiconductor substrate or supporting layer. Epitaxially deposited on support 192 are five semiconductor layers 194–202 wherein layers 196 and 200 are of wider bandgap material than semiconductor layer 198. Support 192 may be p-GaAs upon which is epitaxially deposited buffer layer 194 of p-GaAs, layer 196 of p-$Al_xGa_{1-x}As$, base region 198 of p-GaAs, layer 200 of p-$Al_xGa_{1-x}As$ and cap layer 202 of p-GaAs. Unlike lateral bipolar transistors in the art, prior to the above mentioned patent application, transistor 190 contains emitter and collector regions 204A and 204B formed by IILD wherein impurity enhanced layer interdiffusion occurs in regions 204 via a disordering impurity of n-type, e.g., Si. The selective disordering of regions 204 cause at least a partial if not complete interdiffusion of Ga and Al in the compound semiconductor materials in these regions comprising layers 194–202. These regions will form a lateral n-p-n transistor comprising emitter 204A, base 198 and collector 204B. Device construction is completed by proton implant region 206 which deactivates the parasitic base layer formed by GaAs cap layer 202 between emitter 204A and collector 204B. Then, emitter and collector contacts 208 and 210 are deposited together with base contact 212.

Laterally graded quantum well 198 is shown in exaggerated form relative to scale for purposes of illustration and may be fabricated via optically patterned induced evaporation enhancement or by shadowing the growth with a movable mask as both described in U.S. Pat. No. 4,962,057. Grading monotonically the thickness of quantum well base region 198 so that the thickness of this region monotonically increases from emitter/base junction 205 to collector/base junction 207 thereby effectively grades the bandgap of the base leading to an electric field which enhances the transport of electrons from emitter 204A to collector 204B. To improve current carrying capacity of transistor 190, a multiple quantum well base region may be employed wherein each well is similarly graded as well region 198 in FIG. 13.

For base regions thicker than a quantum well, enhanced carrier transport can be obtained by grading Al content in a base region comprising p-$Al_yGa_{1-y}As$ where x>y. Lateral grading of this kind is disclosed in U.S. Pat No. 4,962,057. Grading either the thickness of a quantum well base layer or the alloy composition of a base layer thicker than a quantum well layer will increase the current gain of the transistor compared to that obtained with a uniform base layer of the same length. Alternatively, lateral grading of either kind will enable current gain to be traded off for increased base length and, thus, lead to simplification of dimensional tolerances. With sufficient grading, it should be possible to obtain a current gain of about 100 with base lengths of 1 μm or more.

Figure 14:
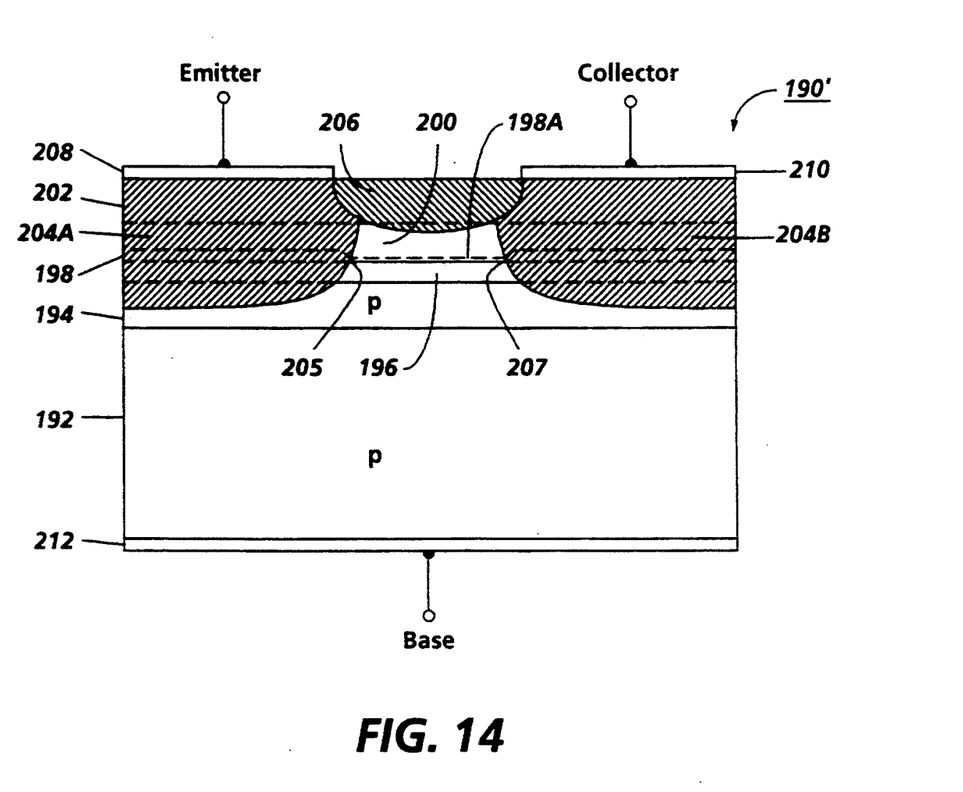
FIG. 14 is a schematic illustration of a side elevation of another embodiment of a lateral n-p-n heterojunction bipolar transistor.

Transistor 190' in FIG. 14 is identical in construction to transistor 190 except for the formation of active region 198. Active region 198 is initially deposited at a thicker width, e.g. 25 nm, and then epitaxial growth of the transistor is interrupted and photo desorption or evaporation is employed to form a thinned annular spot or other shape at 198A so that this base region 198A will have a quantum size effect, e.g. 5 nm, and yet still have good electrical coupling to emitter 204A and collector 204B.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A method of forming a heterojunction laser semiconductor structure comprising the steps of:

epitaxially depositing several semiconductor layers on a substrate, one of said layers having an active region, interrupting the epitaxial growth of said semiconductor layers after the deposition of said layer having an active region, selectively desorbing in situ portions of said layer having an active region to the interface with the layer therebeneath employing photo induced evaporation to form at least one emitter in said portions of said layer not selectively desorbed, and continuing the epitaxial deposition of the remaining semiconductor layers.

2. The method of forming a heterojunction laser semiconductor structure of claim 1 further comprising the step of:

forming a current confinement stripe after continuing the epitaxial deposition of the remaining semiconductor layers.

3. The method of forming a heterojunction laser semiconductor structure of claim 1 wherein more than one emitters are formed by selectively desorbing in situ portions of said layer having an active region to the interface with the layer therebeneath employing photo induced evaporation.

4. A method of forming a waveguide or an antiguide in a heterojunction laser semiconductor structure comprising the steps of:
   epitaxially depositing several semiconductor layers on a substrate, one of said layers having an active region, one of said layers deposited after said layer having an active region being a confinement layer,
   interrupting the epitaxial growth of said semiconductor layers after the deposition of said confinement layer,
   selectively desorbing in situ portions of said confinement layer to near the interface with the layer therebeneath employing photo induced evaporation to form a waveguide or an antiguide, and
   continuing the epitaxial deposition of the remaining semiconductor layers.

5. The method of forming a waveguide or an antiguide in a heterojunction laser semiconductor structure of claim 4 further comprising the step of:
   forming a current confinement stripe after continuing the epitaxial deposition of the remaining semiconductor layers.

6. The method of forming a waveguide or an antiguide in a heterojunction laser semiconductor structure of claim 4 wherein said confinement layer comprises $Al_{0.8}Ga_{0.2}As$ and said semiconductor layer epitaxially deposited on said confinement layer after said selective desorbing comprises $Al_{0.4}Ga_{0.6}As$ to form said waveguide.

7. The method of forming a waveguide or an antiguide in a heterojunction laser semiconductor structure of claim 4 wherein said confinement layer comprises $Al_{0.1}Ga_{0.9}As$ and said semiconductor layer epitaxialy deposited on said confinement layer after said selective desorbing comprises $Al_{0.8}Ga_{0.2}As$ to form said antiguide.

8. The method of forming a waveguide or an antiguide in a heterojunction laser semiconductor structure of claim 4 wherein during epitaxially depositing several semiconductor layers on a substrate, one of said layers being a first confinement layer,
   interrupting the epitaxial growth of said semiconductor layers after the deposition of said first confinement layer,
   selectively desorbing in situ portions of said first confinement layer to near the interface with the layer therebeneath employing photo induced evaporation to form a waveguide or an antiguide, and
   continuing the epitaxial deposition of the remaining semiconductor layers including said layer having an active region, wherein said remaining layers replicate the portion selectively desorped in said confinement layer during deposition.

9. The method of forming a waveguide or an antiguide in a heterojunction laser semiconductor structure of claim 8 wherein said portion selectively desorbing in said confinement layer is a shallow concave region.

10. The method of forming a waveguide or an antiguide in a heterojunction laser semiconductor structure of claim 9 wherein said shallow concave regions formed in said semiconductor layers epitaxially deposited after said confinement layer form waveguides and/or antiguides.

11. A method of forming a waveguide in a heterojunction laser semiconductor structure comprising the steps of:
   epitaxially depositing several semiconductor layers on a substrate, one of said layers having an active region, one of said layers deposited after said layer having an active region being a confinement layer,
   forming a waveguide from a supperlattice confinement region by alternating buried regions and semiconductor layers after the deposition of said layer being a confinement layer, by epitaxially depositing a semiconductor layer, selectively desorbing in situ all but a portion of said confinement layer to the interface with the layer therebeneath employing photo induced evaporation to form said buried region, and epitaxially depositing said semiconductor layer, and
   continuing the epitaxial deposition of the remaining semiconductor layers.

12. The method of forming a waveguide in a heterojunction laser semiconductor structure of claim 11 further comprising the step of:
   forming a current confinement stripe after continuing the epitaxial deposition of the remaining semiconductor layers.

13. The method of forming a waveguide in a heterojunction laser semiconductor structure of claim 11 wherein said buried regions in said supperlattice confinement region are elongated strip regions.

14. The method of forming a waveguide in a heterojunction laser semiconductor structure of claim 11 wherein said buried regions in said supperlattice confinement region are $Al_{0.07}Ga_{0.93}As$ and said semiconductor layers in said supperlattice confinement region are $Al_{0.8}Ga_{0.2}As$.

15. A method of forming a waveguide in a laser semiconductor structure comprising the steps of:
   epitaxially depositing several semiconductor layers on a substrate, one of said layers having an active region,
   interrupting the epitaxial growth of said semiconductor layers after the deposition of said layer having an active region,
   selectively desorbing in situ portions of said layer having an active region to near the interface with the layer therebeneath employing photo induced evaporation to form transparent waveguides, said transparent waveguides being nonabsorbing to propogating radiation from said active region,
   continuing the epitaxial deposition of the remaining semiconductor layers, and
   impurity induced disordering of portions of said portions of said layer selectively desorbed to form an optical waveguide in said portions of said layer selectively desorbed and not impurity induced disordered.

16. A method of forming a waveguide in a laser semiconductor structure comprising the steps of:
   epitaxially depositing several semiconductor layers on a substrate, one of said layers having an active region,
   interrupting the epitaxial growth of said semiconductor layers after the deposition of said layer having an active region,
   selectively desorbing in situ portions of said layer having an active region to near the interface with the layer therebeneath employing photo induced evaporation to form transparent waveguides, and selectively desorbing in situ adjacent portions of said layer having an active region to the interface with the layer therebeneath employing photo induced evaporation, said transparent waveguides being nonabsorbing to propogating radiation from said active region, and continuing the epitaxial deposition of the remaining semiconductor layers.

17. A method of forming a DFB/laser semiconductor structure comprising the steps of:

epitaxially depositing several semiconductor layers on a substrate, one of said layers having an active region, interrupting the epitaxial growth of said semiconductor layers after the deposition of said layer having an active region, selectively desorbing in situ portions of said layer having an active region to near the interface with the layer therebeneath employing photo induced evaporation to form at least one emitter in said portions of said layer not selectively desorbed to near said interface of said layer therebeneath and transparent passive waveguides in said portions of said later selectively desorbed to near said interface of said layer therebeneath, said transparent passive waveguides being nonabsorbing to propogating radiation from said at least one emitter, epitaxially depositing a confinement layer upon said selectively desorbed layer having an active region, selectively desorbing in situ said confinement layer deposited on said transparent passive waveguides employing photo induced evaporation to form a DFB, and continuing the epitaxial deposition of the remaining semiconductor layers.

18. The method of forming a DFB/laser semiconductor structure of claim 17 wherein said confinement layer is selectively desorbed by employing a micromask of periodic thin slits to form said DFB.

19. The method of forming a DFB/laser semiconductor structure of claim 17 wherein said confinement layer is selectively desorbed by interference of two laser beams of appropriate wavelength derived from the same laser source to form said DFB.

20. A method of forming a quantum well wire or box comprising the steps of:

epitaxially depositing a semiconductor layer on a substrate, selectively desorbing in situ portions of said semiconductor layer to the interface with the substrate therebeneath employing photo induced evaporation to form a quantum well wire or box, and continuing the epitaxial deposition of the remaining semiconductor layers.

21. The method of forming a quantum well wire or box of claim 20 wherein said semiconductor layers are doped to provide insulating characteristics.

22. A method of forming a lateral heterojunction bipolar transistor comprising the steps of:

epitaxially depositing several semiconductor layers on a substrate, one of said layers having a narrower bandgap than said adjacent semiconductor layer, interrupting the epitaxial growth of said semiconductor layers after the deposition of said layer having a narrower bandgap, selectively desorbing in situ portions of said layer having a narrower bandgap employing photo induced evaporation to vary the thickness of said layer having an active region to form a base, continuing the epitaxial deposition of the remaining semiconductor layers, said semiconductor layer deposited immediately adjacent to said base having a wider bandgap than said base, impurity induced disordering of a region of said semiconductor layers laterally adjacent to said base to form an emitter, and impurity induced disordering of a region of said semiconductor layers laterally adjacent to said base to form a collector, said emitter, said base and said collector forming a lateral n-p-n transistor.

23. The method of forming a lateral heterojunction bipolar transistor of claim 22 wherein said semiconductor layer above said base and between said emitter and said collector is proton implanted to deactivate the parasitic base layer.

24. The method of forming a lateral heterojunction bipolar transistor of claim 22 wherein said base monotonically increases in thickness from said emitter to said collector.

25. A method of forming a lateral heterojunction bipolar transistor comprising the steps of:

epitaxially depositing several semiconductor layers on a substrate, one of said layers having a narrower bandgap than said adjacent semiconductor layer, interrupting the epitaxial growth of said semiconductor layers after the deposition of said layer having a narrower bandgap, selectively desorbing in situ portions of said layer having a narrower bandgap to near the interface with the layer therebeneath employing photo induced evaporation to form a base, continuing the epitaxial deposition of the remaining semiconductor layers, said semiconductor layer deposited immediately adjacent to said base having a wider bandgap than said base, impurity induced disordering of a region of said semiconductor layers laterally adjacent to said base to form an emitter, and impurity induced disordering of a nother region of said semiconductor layers laterally adjacent to said base to form a collector, said emitter, said base and said collector forming a lateral n-p-n transistor.

* * * * *